United States Patent
Seddon et al.

(10) Patent No.: US 8,084,335 B2
(45) Date of Patent: Dec. 27, 2011

(54) METHOD OF THINNING A SEMICONDUCTOR WAFER USING A FILM FRAME

(75) Inventors: Michael J. Seddon, Gilbert, AZ (US); Francis J. Carney, Queen Creek, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 391 days.

(21) Appl. No.: 12/172,075

(22) Filed: Jul. 11, 2008

(65) Prior Publication Data

US 2010/0009519 A1   Jan. 14, 2010

(51) Int. Cl.
*H01L 21/30* (2006.01)
*H01L 21/46* (2006.01)
*H01L 21/00* (2006.01)

(52) U.S. Cl. ......... 438/464; 438/458; 438/459; 438/460
(58) Field of Classification Search .................. 438/459
See application file for complete search history.

(56) References Cited

U.S. PATENT DOCUMENTS

| | | | |
|---|---|---|---|
| 6,162,702 A | 12/2000 | Morcom et al. | |
| 6,682,981 B2 * | 1/2004 | Leedy | 438/342 |
| 7,148,125 B2 * | 12/2006 | Suzuki et al. | 438/459 |
| 2007/0077731 A1 * | 4/2007 | Masuda | 438/458 |
| 2007/0155131 A1 * | 7/2007 | Contes | 438/458 |
| 2008/0242052 A1 * | 10/2008 | Feng et al. | 438/459 |
| 2010/0003771 A1 * | 1/2010 | Nagai et al. | 438/15 |

\* cited by examiner

*Primary Examiner* — N Drew Richards
*Assistant Examiner* — Michael Jung
(74) *Attorney, Agent, or Firm* — Rennie William Dover

(57) ABSTRACT

A method for manufacturing a thin semiconductor wafer. A semiconductor wafer is thinned from its backside followed by the formation of a cavity in a central region of the backside of the semiconductor wafer. Forming the cavity also forms a ring support structure in a peripheral region of the semiconductor wafer. An electrically conductive layer is formed in at least the cavity. The front side of the semiconductor wafer is mated with a tape that is attached to a film frame. The ring support structure of the semiconductor wafer is thinned to form the thinned semiconductor wafer. A backside tape is coupled to semiconductor wafer and to the film frame and the tape coupled to the front side of the semiconductor wafer is removed. The thinned semiconductor wafer is singulated.

22 Claims, 4 Drawing Sheets

METHOD OF THINNING A SEMICONDUCTOR WAFER USING A FILM FRAME

TECHNICAL FIELD

The present invention relates, in general, to semiconductor wafers and, more particularly, thinned semiconductor wafers.

BACKGROUND

Semiconductor component manufacturers are constantly striving to increase the performance of their products while decreasing their cost of manufacture. As those skilled in the art are aware, discrete semiconductor devices and integrated semiconductor devices such as integrated circuits are fabricated from semiconductor wafers, which are then singulated or diced to produce semiconductor chips. The semiconductor wafers serve as the substrates from which semiconductor devices are manufactured and provide structural support during their manufacture. For adequate structural support, semiconductor wafers typically have a minimum thickness below which the wafers become warped and easily damaged, especially in a manufacturing environment. However, in many applications the thicker semiconductor wafers significantly degrade device performance. When device performance is an issue, semiconductor component manufacturers use thinned semiconductor wafers to take advantage of the performance benefits they give semiconductor devices even though thinning the semiconductor wafers increases the cost of manufacturing a semiconductor device. Techniques for manufacturing semiconductor components from thin semiconductor wafers include wafer bonding and the use of a rigid support system. Wafer bonding techniques greatly increase the cost of semiconductor components because they involve expensive materials, costly processing tools, and highly complex processing techniques that are limited to low temperatures. Like wafer bonding techniques, rigid tape support systems add to the cost of semiconductor components because they increase the processing complexity. Another limitation of rigid tape support systems is that semiconductor wafers become damaged during the separation of the rigid tapes from the semiconductor wafers.

Accordingly, it would be advantageous to have a method for thinning a semiconductor wafer so that it can be used to manufacture a semiconductor component. It would be of further advantage for the method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

For simplicity of illustration and ease of understanding, elements in the various figures are not necessarily drawn to scale, unless explicitly so stated. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or abstract.

DETAILED DESCRIPTION

Generally, the present invention provides a method for manufacturing a thinned semiconductor wafer suitable for use in manufacturing semiconductor components. In accordance an embodiment of the present invention, a semiconductor material having a ring support structure and a cavity is mounted to a front side tape that is mounted to a film frame. The front side tape provides mechanical support to the thinned semiconductor wafer after removal of a portion of the ring support structure. After mounting the semiconductor wafer to the front side tape, the ring support structure is thinned using, for example, a grinding wheel. Alternatively, the ring support structure can be thinned using a laser, a saw, wet etching, dry etching, or the like. The front side tape provides structural support for the thinned semiconductor wafer and guards against the semiconductor wafer warping due to stresses during the thinning process. A backside tape is mounted to the backside of the thinned semiconductor wafer and preferably the front side tape is removed in preparation for singulation of the semiconductor wafer. Thus, the front side tape is exposed to ultraviolet radiation to decrease its tackiness and a backside tape is coupled to the film frame and to the semiconductor wafer from its backside. Then the semiconductor wafer is singulated. The backside tape provides support for the thinned semiconductor wafer during the singulation process.

Figure 1:
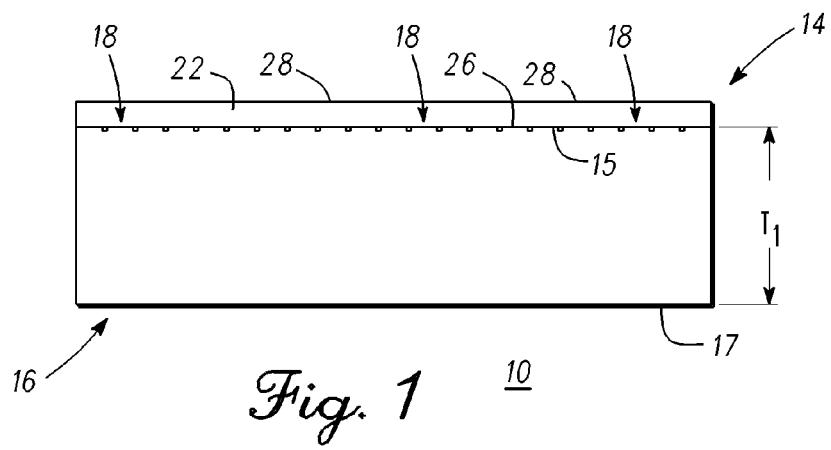
FIG. 1 is a cross-sectional view of a semiconductor wafer used in the manufacture of a semiconductor component in accordance with an embodiment of the present invention.

FIG. 1 is a cross-sectional view of a semiconductor wafer 10 used in the manufacture of semiconductor components in accordance with an embodiment of the present invention. What is shown in FIG. 1 is semiconductor wafer 10 having sides 14 and 16 and an initial thickness $T_1$. Side 14 is referred to as a device side, a top side or a front side and side 16 is referred to as a bottom side or a backside. Semiconductor wafer 10 has a surface 15 on front side 14, a surface 17 on backside 16, and comprises a plurality of semiconductor dice regions 18 separated by scribe lines 20. It should be noted that semiconductor wafer 10 has a plurality of scribe lines 20 that are substantially parallel to each other and a plurality of scribe lines 21 (shown in FIG. 5) that are substantially parallel to each other but substantially perpendicular to the plurality of scribe lines 20. The plurality of scribe lines 20 cooperate with the plurality of scribe lines 21 to form a scribe grid 23 (shown in FIG. 5) that forms a boundary of individual semiconductor chips or dice regions 18.

Semiconductor wafer 10 is mounted to a backgrinding tape 22. More particularly, device side 14 is attached to backgrinding tape 22. It should be noted that backgrinding tape 22 may be a single layer film or a multi-layer film comprising an adhesive surface 26 and a non-adhesive surface 28, where device surface 14 contacts adhesive surface 26. Suitable materials for backgrinding tape 22 include polyester, acrylic, polyimide, an ultraviolet sensitive film, a composite material, or the like.

Figure 2:
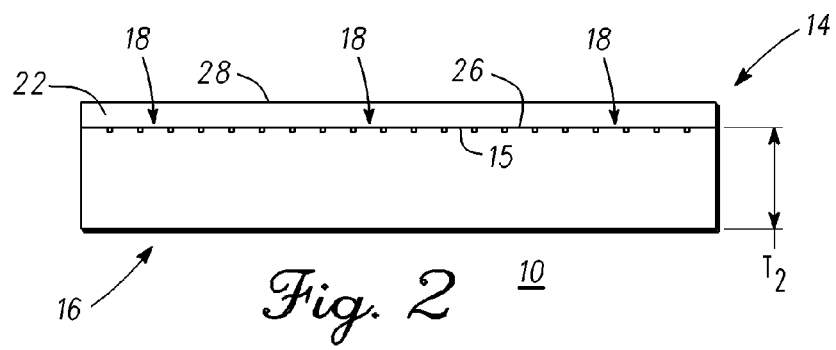
FIG. 2 is a cross-sectional view of the semiconductor wafer of FIG. 1 at a later stage of manufacture.

Referring now to FIG. 2, semiconductor wafer 10 is thinned from backside 16 to have a thickness $T_2$. Thinning semiconductor wafer 10 decreases the distance between surfaces 15 and 17.

Figure 3:
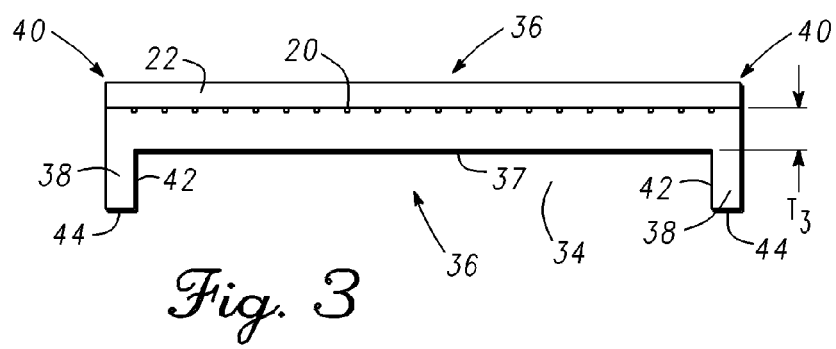
FIG. 3 is a cross-sectional view of the semiconductor wafer of FIG. 2 at a later stage of manufacture.

Referring now to FIG. 3, a cavity 34 is formed in semiconductor wafer 10 by removing a portion of semiconductor wafer 10 from its central region 36 so that the central region has a thickness $T_3$. In other words, cavity 34 is formed by thinning a central region 36 of semiconductor wafer 10 to have thickness $T_3$. By way of example, thickness $T_1$ may be greater than about 600 micrometers (μm), thickness $T_2$ may range from about 200 μm to the full thickness of semiconductor wafer 10, and thickness $T_3$ may be less than about 150 μm. The values of thicknesses $T_1$, $T_2$, and $T_3$ are not limitations of the present invention. Forming cavity 34 leaves a central surface 37 in central region 36 and a rim 38 in a peripheral region 40 of semiconductor wafer 10. Rim 38 has interior sidewalls 42 and a surface 44. It should be noted that surface 44 is a portion of surface 17. The distance between central surface 37 and surface 15 is less than the distance between surfaces 15 and 17. Rim 38 is also referred to as a ring structure, a ring, an edge support ring, a lip, or a support and surface 44 is also referred to as a rim surface. Cavity 34 may be formed by grinding backside 16 at surface 17 with a grinding wheel. Other techniques for forming cavity 34 include milling, dry etching, wet etching, the use of a laser, or the like. Grinding damages semiconductor wafer 10 by creating dislocations and other defects in semiconductor wafer 10. The defects decrease the strength of semiconductor wafer 10 and introduce stresses in and warpage of semiconductor wafer 10. Thus, backside 16 is etched to relieve the stresses caused by the dislocations and defects. The type of stress relief technique, like the technique of forming cavity 34, is not a limitation of the present invention.

Figure 4:
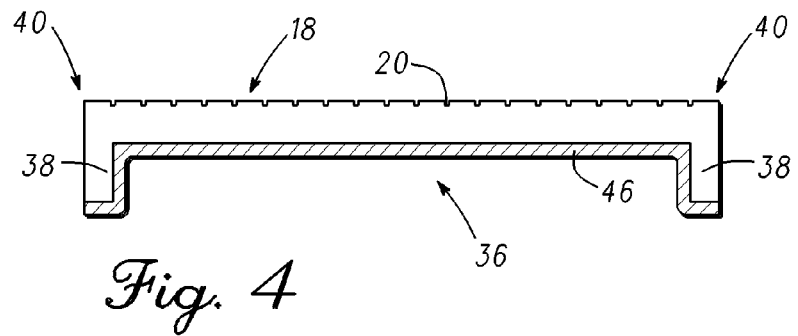
FIG. 4 is a cross-sectional view of the semiconductor wafer of FIG. 3 at a later stage of manufacture.

Referring now to FIG. 4, backgrind tape 22 is exposed to ultraviolet (UV) radiation to decrease its tackiness and then it is removed. A layer of an electrically conductive material 46 having a thickness ranging from about 1.2 μm to about 2 μm is formed on surface 37, interior sidewalls 42, and surface 44. Suitable materials for electrically conductive material 46 include a gold alloy, titanium-nickel-gold, titanium-nickel-silver, or the like. It should be noted that electrically conductive layer 46 may be formed on a portion of surface 37 rather than all of surface 37.

Figure 5:
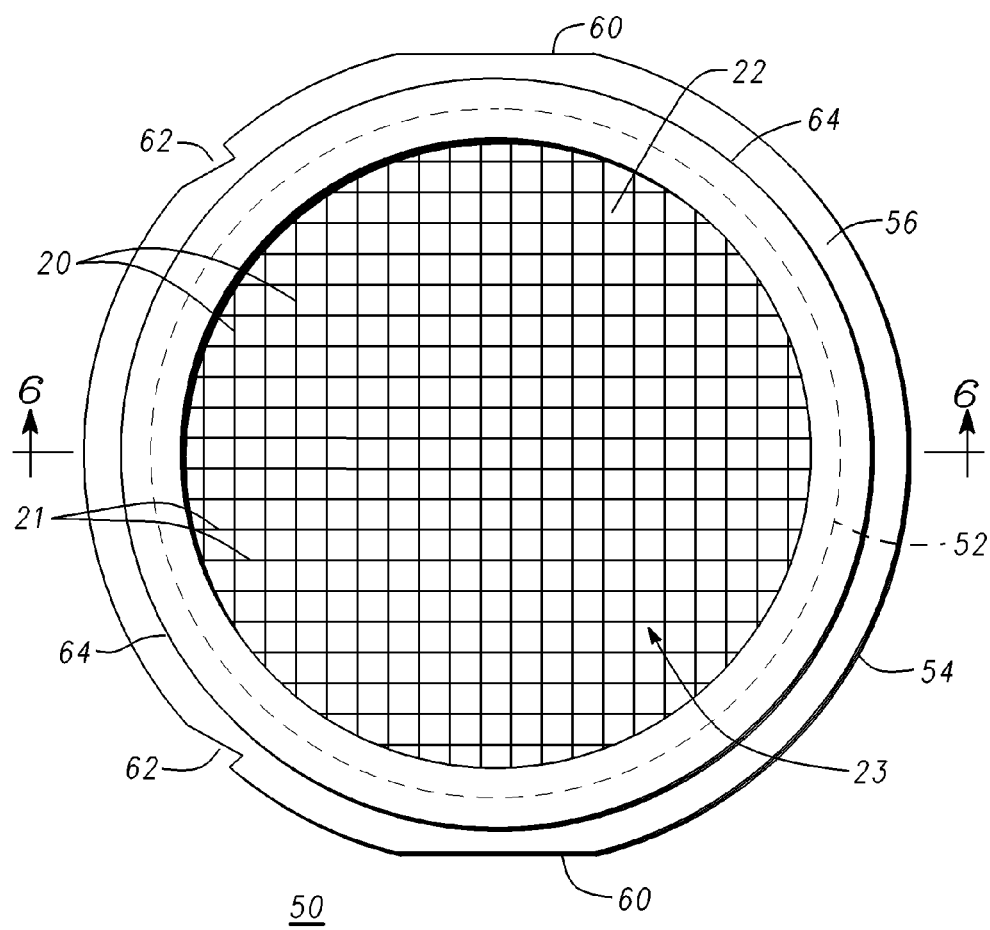
FIG. 5 is a top view of a film frame and a film in combination with the semiconductor wafer of FIG. 4.
Figure 6:
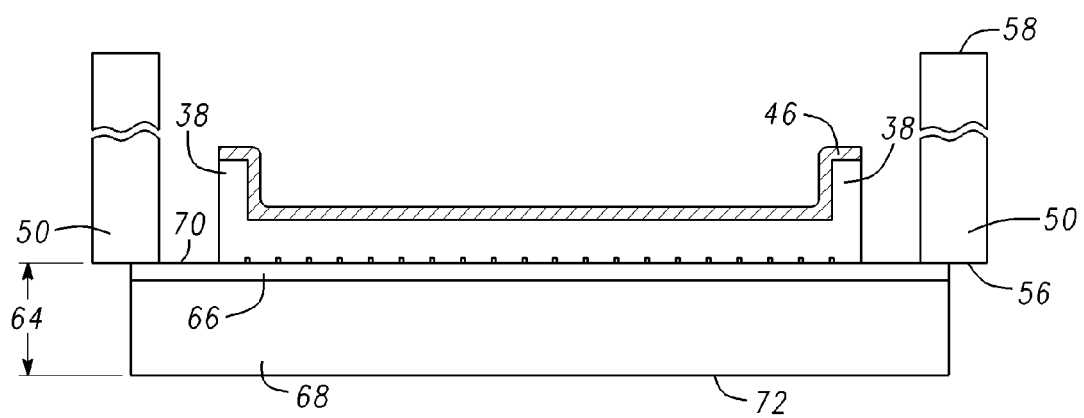
FIG. 6 is a cross-sectional view of the film frame, the film, and the semiconductor wafer of FIG. 5 taken along section line 6-6 of FIG. 5.

FIG. 5 is a top view of a film frame 50, a tape 64, and semiconductor wafer 10 in accordance with an embodiment of the present invention. Film frame 50 has an annular shape with an inner edge 52 and an outer edge 54. Because FIG. 5 is a top view, inner edge 52 and semiconductor wafer 10 are below tape 64. Scribe lines 20 and 21 are formed in semiconductor wafer 10. In addition, film frame 50 has top and bottom surfaces 56 and 58, respectively, (bottom surface 58 is shown in FIG. 6) a pair of flats 60 on opposing sides and a pair of positioning notches 62 for receiving guide pins (not shown). Film frame 50 is also referred to as a mounting frame assembly.

FIG. 6 illustrates a cross-sectional view of film frame 50 and tape 64 taken along section line 6-6 of FIG. 5. Film frame 50 is thicker than semiconductor wafer 10 as indicated by the break lines in film frame 50. Tape 64 may comprise a two-layer system in which an adhesive layer 66 is disposed on a base film 68, wherein adhesive layer 66 has a surface 70 that is sticky or tacky and base film 68 has a non-sticky surface 72. Surface 70 may be referred to as an adhesive surface. Tape 64 may have a thickness ranging from about 100 μm to about 300 μm, where adhesive layer 66 may have a thickness ranging from about 15 percent (%) to about 30% of the thickness of tape 64. Preferably, tape 64 is an Ultraviolet (UV) radiation curable tape that loses its stickiness or tackiness by exposure to UV radiation. It is also preferable that tape 64 does not oscillate at the resonant frequency of the grinding wheel. Suitable tapes for tape 64 include, but are not limited to, tapes made by The Furukawa Electric Co., Ltd. having product numbers SP590M and SP537T, tapes made by Nitto Denko Corporation, having product numbers UB3083-D and BT-50EF, or the like. Semiconductor wafer 10 is mounted to tape 64 such that device side 14 contacts adhesive surface 70.

Semiconductor wafer 10 is mounted to tape 64 to adhesively stabilize semiconductor wafer 10. When mounted, device side 14 of semiconductor wafer 10 contacts adhesive surface 70 of tape 64. It should be noted that film frame 50 is shown in an inverted or upside down configuration.

Figure 7:
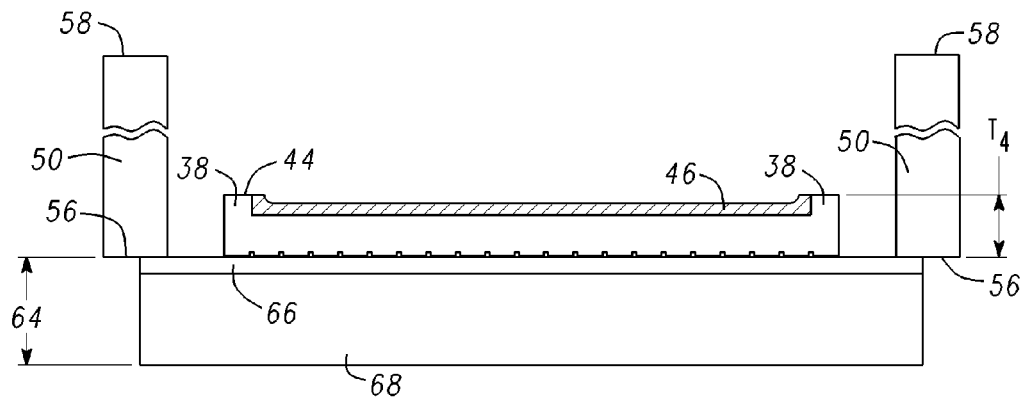
FIG. 7 is a cross-sectional view of the film frame, the film, and the semiconductor wafer of FIG. 6 taken along the same cross-sectional region as that shown in FIG. 5.

FIG. 7 is a cross-sectional view of film frame 50, tape 64, and semiconductor wafer 10 taken along the same cross-sectional region as that shown in FIG. 5. Rim 38 is thinned to have a thickness $T_4$ which is intermediate in value between thicknesses $T_2$ and $T_3$. The distance between rim surface 44 and surface 15 is greater than the distance between central surface 37 and surface 15. It is desirable that thickness $T_4$ be greater than thickness $T_3$ so that metallization layer 46 not be damaged by the thinning process. In accordance with an embodiment of the present invention, film frame 50 has a thickness of about 150 μm, thickness $T_4$ is about 110 μm, and thickness $T_3$ is about 100 μm. Thus, lip or rim 38 has a thickness of about 10 μm. By way of example, rim 38 is thinned using a grinding process. Alternatively, rim 38 can be thinned using a laser, a saw, wet or dry etching, or the like. Thinning rim 38 makes semiconductor wafer 10 a thinned semiconductor wafer. After grinding rim 38, semiconductor wafer 10 is washed with a solvent such as water using an atomizing nozzle to remove any particulates that may be created by the grinding process. The type of material for cleaning semiconductor wafer 10 is not a limitation of the present invention.

Figure 8:
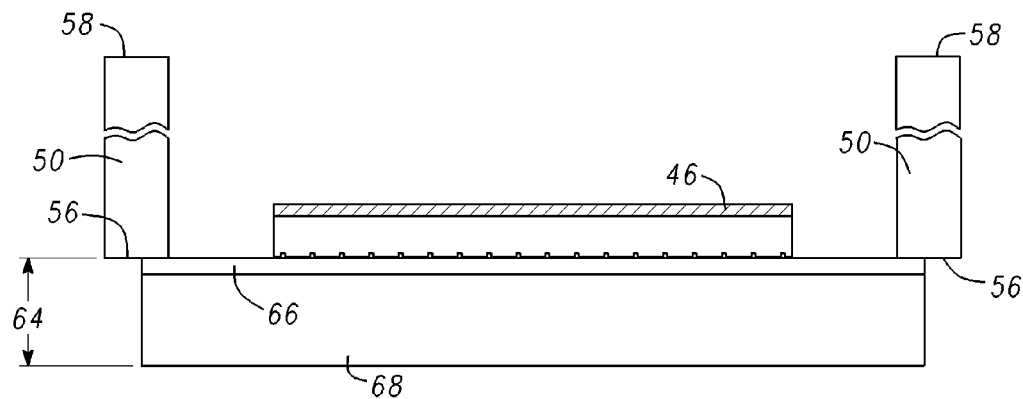
FIG. 8 is a cross-sectional view of the film frame, the film, and the semiconductor wafer of FIG. 6 taken along the same cross-sectional region as that shown in FIG. 5 in accordance with an embodiment in which a ring support structure is removed.

In accordance with another embodiment of the present invention, rim or ring structure 38 is completely removed from semiconductor wafer 10. By way of example, ring structure 38 can be removed by cutting through semiconductor wafer 10 along peripheral region 40. FIG. 8 is a cross-sectional view of semiconductor wafer 10 having ring structure 38 removed using, for example, laser cutting.

Figure 9:
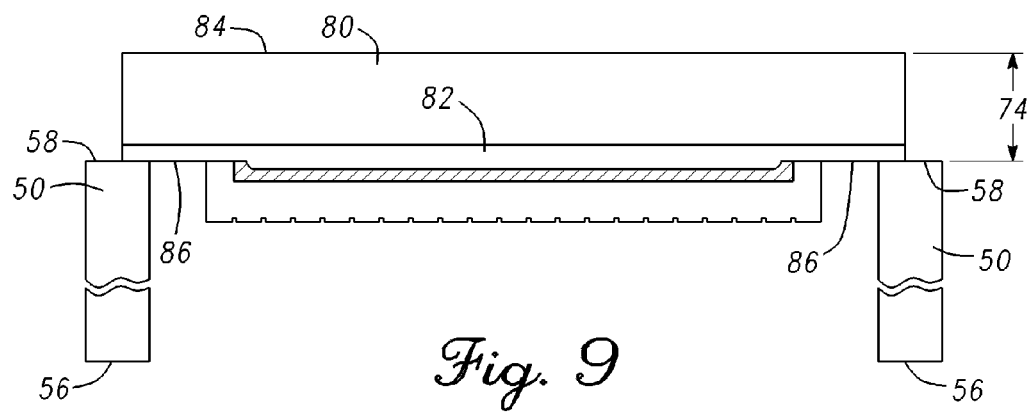
FIG. 9 is a cross-sectional view of the film frame, the film, and the semiconductor wafer of FIG. 7 at a later stage of manufacture.

Referring now to FIG. 9, tape 64 is exposed to UV radiation to decrease its tackiness. A dicing tape 74 having opposing surfaces 84 and 86 is mounted to bottom surface 58 of film frame 50 and to semiconductor wafer 10. Preferably dicing tape 74 is a UV radiation curable tape that comprises a base film 80 and an adhesive layer 82 coated on a surface of base film 80. Base film 80 is a substantially non-tacky support layer having surface 84 and adhesive layer 82 has tacky or sticky surface 86. Preferably adhesive layer 82 is sufficiently thick to flow into cavity 34 (shown in FIG. 3) and tape 74 is stretchable so that it can be used in a pick and place machine. By way of example, base film 80 is composed of polyvinylchloride and adhesive layer 82 is composed of an acrylic resin. Tape 74 may have a thickness ranging from about 100 μm to about 300 μm, where adhesive layer 82 may have a thickness ranging from about 15 percent (%) to about 30% of the thickness of tape 74. Suitable tapes for dicing tape 74 include, but are not limited to, tapes made by Lintec Advanced Technologies (USA), Inc. (Adwill) having product numbers D175, D185, 510W, and 510T, tapes made by Denki Kagaku Kogyo having product number UHP-1525M3, or the like. Tape 64 is removed.

Figure 10:
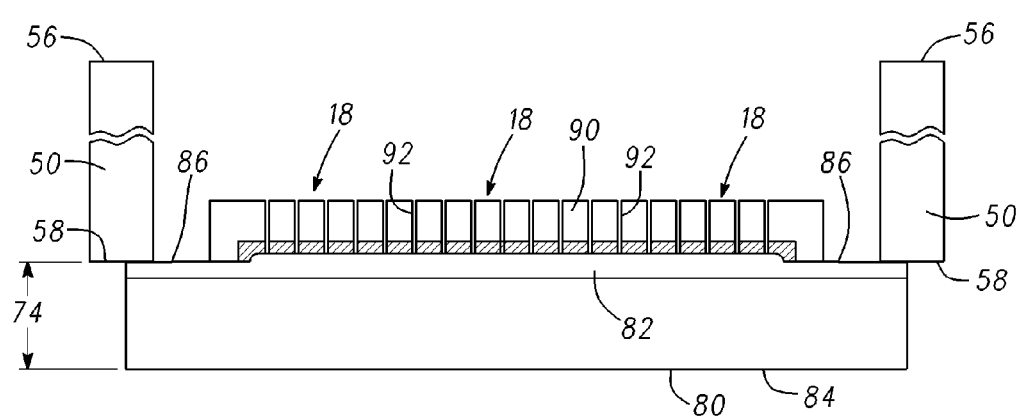
FIG. 10 is a cross-sectional view of the semiconductor wafer of FIG. 8 after singulation.

Referring now to FIG. 10, film frame 50 having semiconductor wafer 10 and dicing tape 74 is placed on a dicing machine which cuts or saws semiconductor wafer 10 along scribe lines 20 and 21 to form individual semiconductor chips 90 from semiconductor dice regions 18. Semiconductor chips 90 have sides 92. The process of cutting a substrate such as a semiconductor wafer 10 into individual elements is referred to as dicing or singulating semiconductor wafer 10 or dicing or singulating the substrate. Semiconductor dice 90 are then removed from dicing tape 74.

By now it should be appreciated that a method for thinning a semiconductor wafer has been provided wherein the method includes forming a ring support structure from a semiconductor wafer, mounting the semiconductor wafer to a film frame, and thinning the ring support structure. A front side tape in combination with the film frame is used to provide support for the semiconductor wafer during the thinning of the ring support structure. After thinning the ring support structure, a backside tape in combination with the film frame is used to provide support for the thinned semiconductor wafer during singulation of the wafer.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for thinning a semiconductor wafer, comprising:
providing the semiconductor wafer having first and second sides, a central region, a peripheral region, and first and second surfaces substantially parallel to each other, the first surface on the first side and the second surface on the second side, the first surface having a first portion spaced apart from the second surface by a first distance and a second portion spaced apart from the second surface by a second distance that is different from the first distance, a cavity extending into the central region of the semiconductor wafer from the first side, and a ring support structure in the peripheral region, the first portion of the first surface in the central region and the second portion of the first surface in the peripheral region;
providing a film frame having first and second surfaces and a first tape mounted to the first surface of the film frame;
mounting the semiconductor wafer to the first tape, wherein the second side of the semiconductor wafer contacts the first tape;
thinning at least a portion of the ring support structure, wherein the ring support structure has a thinned portion that remains after thinning, the thinned portion having a thickness that is less than the second distance and a surface that is substantially parallel to the second surface; and
after thinning the portion of the ring support structure, mounting a second tape to the second surface of the film frame and to the semiconductor wafer.

2. The method of claim 1, wherein thinning the at least a portion of the ring support structure includes grinding the ring support structure.

3. The method of claim 2, wherein thinning the at least a portion of the ring support structure includes using a technique selected from the group of thinning techniques comprising polishing, wet etching, and dry etching.

4. The method of claim 1, further including removing the first tape and singulating the semiconductor wafer.

5. The method of claim 4, wherein removing the first tape includes exposing the first tape to ultraviolet radiation.

6. The method of claim 1, wherein providing the semiconductor wafer includes providing an electrically conductive material in at least the cavity.

7. A method for thinning a semiconductor wafer, comprising:
providing the semiconductor wafer having first and second major surfaces that are on opposite sides of the semiconductor wafer form each other, a central region, and a peripheral region, wherein the first major surface has first and second portions, the first portion of the first major surface in the central region and the second portion of the first major surface in the peripheral region, and a first distance between the first portion of the first major surface and the second major surface and between the second portion of the first major surface and the second major surface;
removing a portion of the semiconductor wafer from the central region, wherein removing the portion of the semiconductor wafer forms a central surface in the central region and a rim having a rim surface formed from the second portion of the first major surface in the peripheral region, the central surface spaced apart from the second major surface by a second distance, the second distance less than the first distance;
adhesively stabilizing the semiconductor wafer on a first tape; and
thinning the rim, wherein thinning the rim forms a thinned rim surface that is substantially parallel to the second major surface and spaced apart from the second major surface by a third distance; and
after thinning the rim, mounting a second tape to the thinned rim surface and to the semiconductor substrate.

8. The method of claim 7, further including forming an electrically conductive material in at least the central region.

9. The method of claim 8, wherein forming the electrically conductive material in at least the central region comprises forming a layer of metal in the central region.

10. The method of claim 8, wherein forming the electrically conductive material in at least the central region includes forming the electrically conductive material on the rim surface.

11. The method of claim 7, wherein thinning the rim leaves the thinned rim surface spaced apart from the electrically conductive material.

12. The method of claim 11, wherein adhesively stabilizing the semiconductor wafer comprises:
providing a film frame having a tape mounted thereto; and
mounting the semiconductor wafer to the tape.

13. The method of claim 7, further including singulating the semiconductor wafer into semiconductor dice.

14. The method of claim 7, wherein removing the portion of the semiconductor wafer from the central region includes grinding the central region of the semiconductor wafer.

15. The method of claim 7, wherein adhesively stabilizing the semiconductor wafer comprises mounting the semiconductor wafer to a tape.

16. The method of claim 15, further including mounting a dicing tape to at least the rim surface.

17. A method for manufacturing a semiconductor component, comprising:

providing a semiconductor wafer having first and second sides and first and second surfaces substantially parallel to each other, the first surface on the first side and the second surface on the second side, the first surface having a first portion spaced apart from the second surface by a first distance and a second portion spaced apart from the second surface by a second distance that is different from the first distance, a cavity extending into the semiconductor wafer from the first side, and a ring support structure at a periphery of the first side of the semiconductor wafer;

providing a film frame having first and second sides and a first tape attached to the first side of the film frame;

mating the second side of the semiconductor wafer to the first tape;

thinning at least a portion of the ring support structure to form a support surface that is substantially parallel to the second surface, wherein the support surface is spaced apart from the second surface by a third distance; and after thinning the portion of the ring support structure, mating a second tape to at least the first side of the semiconductor wafer.

18. The method of claim 17, further including singulating the semiconductor wafer.

19. The method of claim 17, further including removing the first tape from the semiconductor wafer.

20. The method of claim 17, wherein mating the second tape to at least the first side of the semiconductor wafer includes mating the second tape to the second side of the film frame.

21. The method of claim 20, further including singulating the semiconductor wafer.

22. The method of claim 17, further including forming a layer of electrically conductive material in at least a portion of the cavity.

* * * * *